United States Patent
Li et al.

(10) Patent No.: US 8,362,809 B2
(45) Date of Patent: Jan. 29, 2013

(54) DUAL-MODE VOLTAGE CONTROLLED OSCILLATOR, FREQUENCY SYNTHESIZER AND WIRELESS RECEIVING DEVICE

(75) Inventors: Wei Li, Shanghai (CN); Jin Zhou, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/266,759

(22) PCT Filed: Apr. 14, 2011

(86) PCT No.: PCT/CN2011/000658
§ 371 (c)(1),
(2), (4) Date: Nov. 30, 2011

(87) PCT Pub. No.: WO2011/127754
PCT Pub. Date: Oct. 20, 2011

(65) Prior Publication Data
US 2012/0081155 A1    Apr. 5, 2012

(30) Foreign Application Priority Data

Apr. 15, 2010 (CN) .......................... 2010 1 0148275

(51) Int. Cl.
*H03B 21/00* (2006.01)
(52) U.S. Cl. ......... 327/105; 331/2; 331/49; 331/117 FE; 331/179; 455/264
(58) Field of Classification Search .......... 327/105–107; 331/2, 49, 117 R, 117 FE, 179; 455/76, 77, 455/260, 264
See application file for complete search history.

(56) References Cited

U.S. PATENT DOCUMENTS

| | | | | |
|---|---|---|---|---|
| 6,462,626 B1 * | 10/2002 | Gharpurey | ................ | 331/108 B |
| 6,870,432 B2 * | 3/2005 | Li et al. | ........................... | 331/46 |
| 6,995,619 B2 * | 2/2006 | Cho | ................................ | 331/45 |
| 7,342,462 B1 * | 3/2008 | Chen | ............................... | 331/45 |

FOREIGN PATENT DOCUMENTS

WO    WO 03088497 A1 * 10/2003

* cited by examiner

*Primary Examiner* — Lincoln Donovan
*Assistant Examiner* — William Hernandez
(74) *Attorney, Agent, or Firm* — McDonnell Boehnen Hulbert & Berghoff LLP

(57) ABSTRACT

The invention provides a dual-mode voltage-controlled oscillator (DMVCO), a frequency synthesizer and a wireless receiving device, and pertains to the technical field of integrated circuit of radio frequency wireless receiver. The DMVCO and the frequency synthesizer can operate in a wideband mode and a quadrature mode. When operating in the quadrature mode, a quadrature signal is provided for a Single Sideband Mixer of the frequency synthesizer by a quadrature coupling of a first voltage-controlled oscillator unit and a second voltage-controlled oscillator unit in the DMVCO in the overlapped frequency band so that the frequency synthesizer can cover a higher output frequency band. Therefore, the tuning range of the DMVCO of the invention is wide, and the frequency synthesizer using the DMVCO is low in power consumption, simple in structure and has good frequency spur performance.

20 Claims, 6 Drawing Sheets

Wide band Mode

Quadrature Mode

DUAL-MODE VOLTAGE CONTROLLED OSCILLATOR, FREQUENCY SYNTHESIZER AND WIRELESS RECEIVING DEVICE

FIELD OF THE INVENTION

The present invention pertains to the technical field of integrated circuit of radio frequency wireless receiver, and relates to a dual-mode voltage-controlled oscillator (DM-VCO) which can operate in a wideband mode or a quadrature mode as well as a frequency synthesizer and a wireless receiving device which utilizes the DMVCO.

BACKGROUND

With the fast development of wireless communication technology, more and more wireless communication devices have been put into use in people's daily lives. Under this background, more and more wireless communication standards have arisen in present spatial environment in pursuit of faster data transfer rate and higher utilization rate of frequency spectrum.

FIG. 1 shows a distribution of frequency spectrum of some communication standards in present spatial environment. For example, mobile communication is one of the most important applications of wireless technology. On the basis of the second generation mobile communication GSM (Global System of Mobile Communication) mode which is widely used currently, mobile communication is now striding into an era of the third generation mobile communication in depth. The third generation mobile communication includes TD-SCDMA of Chinese standard, WCDMA of European standard and CDMA2000 of North American standard. Therefore, wireless signals of different frequencies and different modes which support mobile communication will co-exist for a long term spatially between the second generation mobile communication and the third generation mobile communication as well as between different standards of the third generation mobile communication. In the meantime, as people demands more and more for high speed wireless transmission of data, wireless data communication, especially the wireless wideband data communication technology is developing rapidly. Communication standards that are currently widely used includes Bluetooth and Wi-Fi, and communication standard UWB (Ultra Wideband) having wider band and faster speed in the future, etc. Wireless navigation application is also included. Positioning and navigation system such as GPS (Global Positioning System)/Galileo/BeiDou are also developing rapidly. Broadcasting application is all the more the case. Domestic and international standards such as DTMB (Digital Television Terrestrial Multimedia Broadcasting), CMMB (China Mobile Multimedia Broadcasting), DVB-H (Digital Video Broadcasting-Handheld) and industrial standards are becoming mature or in the process of industrialization advance.

Under the tendency of development of such wireless communication technologies in present days, a wireless receiver which can support multi-standard and multi-mode is especially important, which conforms to the significant tendency of development of radio technology of software-defined radio (SDR) and can greatly improve the reconfigurability of wireless receiver. Therefore, an attempt to propose a radio receiver that supports multi-mode and reconfiguration has been made in the prior art. However, in order to achieve such a radio receiver, the design of a high performance frequency synthesizer with a wideband range is one of the crux; further, a voltage-controlled oscillator (VCO), which can provide the frequency synthesizer with a quadrature local oscillation signal in a wide tuning range (TR) in order to modulate and demodulate wireless signal, is the core of technology.

Currently, in most commercial multi-mode communication devices, a wireless receiver which supports multi-mode typically integrates respective chips of various communication modes into one circuit board. Such a simple stack will lead to increase of power consumption, weight and area of wireless receiver, and the cost will be increased greatly. Therefore, it is a certain tendency that the wireless receiver develops towards the direction of multi-mode and single chip.

In the article entitled "A CMOS 100 MHz to 6 GHz Software Defined Radio Analog Front-end with Integrated Pre-Power Amplifier" to M. Ingets et al (published on ESSCIRC 2007, pages 456-439), a wideband frequency synthesizer is proposed. The frequency synthesizer utilizes a Single Sideband Mixer (SSBM) to perform a upconversion operation to expand frequency band, and utilizes a plurality of Poly Phase Filters (PPF) to provide the Single Sideband Mixer (SSBM) with a quadrature signal; however, in order to improve the operation frequency range of PPF, the number of orders of PPF must be increased, which will necessarily increase power consumption of the frequency synthesizer.

In the article entitled "A 0.75 to 2.2 GHz Continuously-Tunable Quadrature VCO" to M. Ingets et al (published on) to Davide Guermandi et al (published on IEEE ISSCC Digest of Technical Papers, pages 536-537, February, 2005), a wideband frequency synthesizer is proposed. The frequency synthesizer also utilizes a SSBM to perform a upconversion operation to expand frequency band, but utilizes a Quadrature Voltage-Controlled Oscillator (QVCO) to provide the SSBM with a quadrature signal. QVCO, however, has a very limited tuning range, large power consumption and a poor ability in harmonic restraining.

In the article entitled "A 0.1-5 GHz Dual-VCO Software-Defined ΣΔ Frequency Synthesizer in 45 nm Digital CMOS" to Pierluigi Nuzzo et al (published on paper collection "IEEE Radio Frequency Integrated Circuits Symp.", pages 303-306, June, 2008), a wideband frequency synthesizer is proposed. In this frequency synthesizer, in order to achieve a wide tuning range of voltage-controlled oscillator, two voltage-controlled oscillators which operate in two different frequency bands (high and low) respectively are utilized to cover a very wide tuning range. However, such an architecture demands that the voltage-controlled oscillator operates at a frequency which is two times as big as the required frequency. Then, a mirror is created by Divider(s)-by-2 to refrain the quadrature signal required by the receiver. Due to the use of a high-frequency divider (and also a high-frequency buffer in some cases), the frequency synthesizer of such an architecture has to consume a lot of power in high frequency band, and it is hard to give simultaneous considerations to both the bandwidth and power consumption.

SUMMARY OF THE INVENTION

In order to overcome the aforesaid or other disadvantages, the invention proposes a DMVCO and a frequency synthesizer which can operate in both a wideband mode and a quadrature mode.

In accordance with one aspect of the invention, a dual-mode voltage-controlled oscillator is proposed, which comprises a first voltage-controlled oscillator unit and a second voltage-controlled oscillator unit, the first voltage-controlled oscillator unit operating in a first frequency band, the second voltage-controlled oscillator unit operating in a second frequency band, the first frequency band and the second frequency band having an overlapped frequency band therebetween;

each of the voltage-controlled oscillator units comprises a quadrature coupling module;

the dual-mode voltage-controlled oscillator is operable to operate in a wideband mode or a quadrature mode;

wherein, when operating in the wideband mode, a differential signal at a corresponding frequency is generated by only the first voltage-controlled oscillator unit or the second voltage-controlled oscillator unit;

when operating in the quadrature mode, both the first voltage-controlled oscillator unit and the second voltage-controlled oscillator unit operates in the overlapped frequency band, the first voltage-controlled oscillator unit and the second voltage-controlled oscillator unit are coupled together by the quadrature coupling modules of the first voltage-controlled oscillator unit and the second voltage-controlled oscillator unit, and a quadrature signal at a corresponding frequency is generated.

In a preferred embodiment of a dual-mode voltage-controlled oscillator in accordance with the invention, the first voltage-controlled oscillator unit and the second voltage-controlled oscillator unit have substantially the same frequency tuning characteristics in the overlapped frequency band.

Preferably, each of the voltage-controlled oscillator units further comprises:

a switched capacitor array for controlling the frequencies at which corresponding tuning curves of the first voltage-controlled oscillator unit and the second voltage-controlled oscillator unit in the overlapped frequency band prevail to be the same; and a switched varactor array for controlling tuning gains of corresponding tuning curves of the first voltage-controlled oscillator unit and the second voltage-controlled oscillator unit in the overlapped frequency band to be substantially the same.

Preferably, the switched capacitor array comprises a plurality of switched capacitor units each for correspondingly controlling the frequency at which one tuning curve in the overlapped frequency band prevails.

Preferably, the switched varactor array comprises a plurality of switched varactor units each for correspondingly controlling tuning gain of one tuning curve in the overlapped frequency band.

Preferably, the switched capacitor array further comprises a plurality of binary-weighted switched capacitor units, for correspondingly controlling the frequency at which tuning curves of the voltage-controlled oscillator outside the overlapped frequency band prevails.

In another preferred embodiment, each voltage-controlled oscillator unit further comprises:

a fixed varactor module having a linearization function for controlling linearization degree of tuning curves of the first voltage-controlled oscillator unit and the second voltage-controlled oscillator unit.

In still another preferred embodiment, each voltage-controlled oscillator unit further comprises:

a phase-shifting network module for providing a phase-shift of substantially 90° in order to reduce the sensitivities of the first voltage-controlled oscillator unit and the second voltage-cbntrolled oscillator unit to frequency mismatch and amplitude mismatch in the overlapped frequency band.

In another embodiment of a dual-mode voltage-controlled oscillator in accordance with the invention, each voltage-controlled oscillator unit further comprises an on-chip inductor and a parasitic capacitor.

Preferably, each voltage-controlled oscillator unit further comprises:

a negative resistance module for providing resonant cavities of the voltage-controlled oscillator units with energy required for oscillating;

wherein the negative resistance module comprises two transistors cross-coupled with each other and a first current source array; by controlling the first current source array to adjust the magnitude of current flowing through the cross-coupled transistors, the amplitude of output signals of the first voltage-controlled oscillator unit or the second voltage-controlled oscillator unit can be controlled.

Preferably, a first switch is provided between the first current source array and the cross-coupled transistors; when the dual-mode voltage-controlled oscillator operates in the wideband mode, the first switch is controlled to select any one of the first voltage-controlled oscillator unit and the second voltage-controlled oscillator unit.

Preferably, the quadrature coupling module comprises two quadrature coupled transistors, wherein the gate electrode of each of the quadrature coupled transistors in the first voltage-controlled oscillator unit/the second voltage-controlled oscillator unit is coupled with a corresponding output signal of the resonant cavity of the first voltage-controlled oscillator unit/the second voltage-controlled oscillator unit.

Preferably, a second current source array for providing the quadrature coupled transistors with biased current is provided in each of the voltage-controlled oscillator units.

Preferably, a second switch is provided between the quadrature coupled transistors and the second current source array, which is controlled to achieve a switching of the dual-mode voltage-controlled oscillator between the wideband mode and the quadrature mode.

Specifically, the first frequency band is substantially from 3 GHz to 4.8 GHz, the second frequency band is about from 4 GHz to 6 GHz, and the overlapped frequency band is about from 4 GHz to 4.8 GHz.

According to another aspect of the invention, a frequency synthesizer comprising a local oscillation generator is provided, the local oscillation generator comprises:

any of the dual-mode voltage-controlled oscillators as described above;

a Quadrature Single Sideband Mixer (QSSBM); and a divider of one order or above;

wherein, the frequency synthesizer is operable to operate in a wideband mode or a quadrature mode;

when operating in the wideband mode, a differential signal generated by the first voltage-controlled oscillator unit or the second voltage-controlled oscillator unit is processed by the divider to generate a first quadrature local oscillation signal;

when operating in the quadrature mode, a quadrature signal output after a quadrature coupling process and a quadrature signal output by the divider are input into the Quadrature Single Sideband Mixer (QSSBM) to perform a upconversion so as to generate a second quadrature local oscillation signal;

the first quadrature local oscillation signal is used to cover a first output frequency band having a relatively low frequency, and the second quadrature local oscillation signal is used to cover a second output frequency band having a relatively high frequency.

According to an embodiment of the frequency synthesizer provided by the invention, the local oscillation generator further comprises a first order frequency selecting device and a second order frequency selecting device;

wherein the first order frequency selecting device selects a differential signal at a corresponding frequency output by the first voltage-controlled oscillator unit or the second voltage-controlled oscillator unit to be sent to the divider, the second order frequency selecting device selects a quadrature signal output by any of dividers to output the first quadrature local oscillation signal.

Preferably, the first output frequency band may be about from 0.4 GHz to 3 GHz, and the second output frequency band may be about from 5 GHz to 6 GHz.

According to still another aspect of the invention, a wireless receiving device is provided, which comprises any of the frequency synthesizer as described above.

The technical effects of the inventions are described as follows. When the frequency synthesizer covers a lower output frequency band (for example, 0.4-3 GHz), the frequency synthesizer and DMVCO operate in a wideband mode and DMVCO operates at a relatively lower frequency; therefore, the power consumption of divider and buffer used by the frequency synthesizer will be greatly reduced; when the frequency synthesizer covers a higher output frequency band (for example, 5-6 GHz), the frequency synthesizer and DMVCO operate in a quadrature mode, a quadrature signal required by QSSBM is provided by two voltage-controlled oscillators operating in a overlapped frequency band in DMVCO, thus avoiding the use of additional PPF and QVCO; therefore, the structure of frequency synthesizer which employs DMVCO is not complicated; not only the range of output frequency is guaranteed, but power consumption will not be increase, meaning that requirements on both the range of output frequency and power consumption are met. Moreover, QSSBM used in the frequency synthesizer can refrain a mirror signal occurring in frequency mixing, improve frequency spectrum purity of voltage-controlled oscillator, and the voltage-controlled oscillator has good frequency spur performance.

BRIEF DESCRIPTION OF THE DRAWINGS

The above and other objectives and advantages of the invention will become more thoroughly clear from the following detailed description in connection with the accompanying drawings, wherein identical or similar elements are indicated by identical reference numerals.

DETAILED DESCRIPTION OF THE INVENTION

Some of the many possible embodiments of the invention will be described below in order to provide a basic understanding of the invention and not to identify crucial or decisive elements of the invention or define the scope of protection. It can be easily understood that according to the technical solutions of the invention, those with ordinary skills in the art can propose other alternative implementations without departing from the true spirit of the invention. Therefore, the following embodiments and accompanying drawings are illustrative description of technical solutions of the invention, and should not be construed as constituting the whole of the invention or as limiting or defining technical solutions of the invention.

Hereinafter, a wideband-quadrature dual-mode voltage-controlled oscillator refers to a DMVCO that can operate in a wideband mode or a quadrature mode respectively, wherein "wideband mode" indicates performing a division operation on the output signal of one voltage-controlled oscillator of DMVCO so as to generate a quadrature signal, and "quadrature mode" indicates coupling two voltage-controlled oscillators of DMVCO together so as to generate a quadrature signal.

When designing VCO and frequency synthesizer, considerations should be simultaneously given to following performance indexes: range of frequency (i.e., tuning range of VCO, or output frequency range of frequency synthesizer), phase noise, frequency spur, power consumption and chip area, etc.

Figure 2:
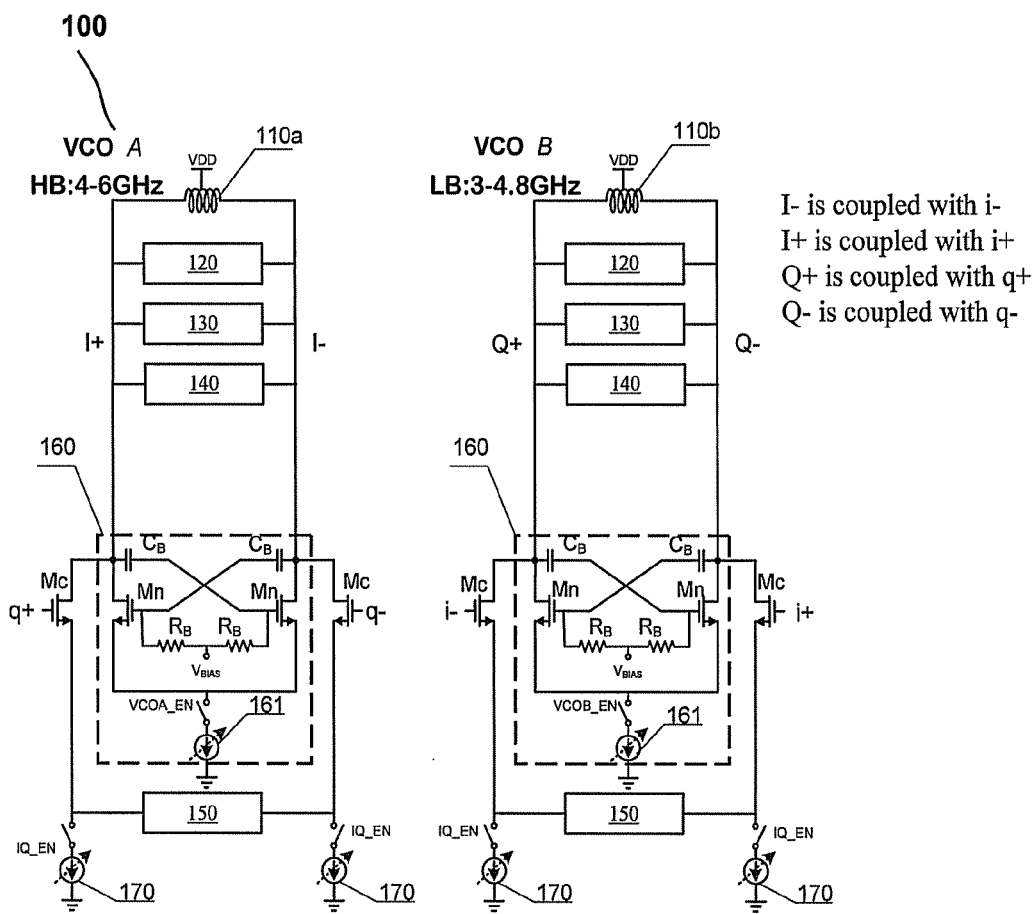
FIG. 2 is a schematic structural view of wideband-quadrature DMVCO provided according to an embodiment of the invention.
Figure 3:
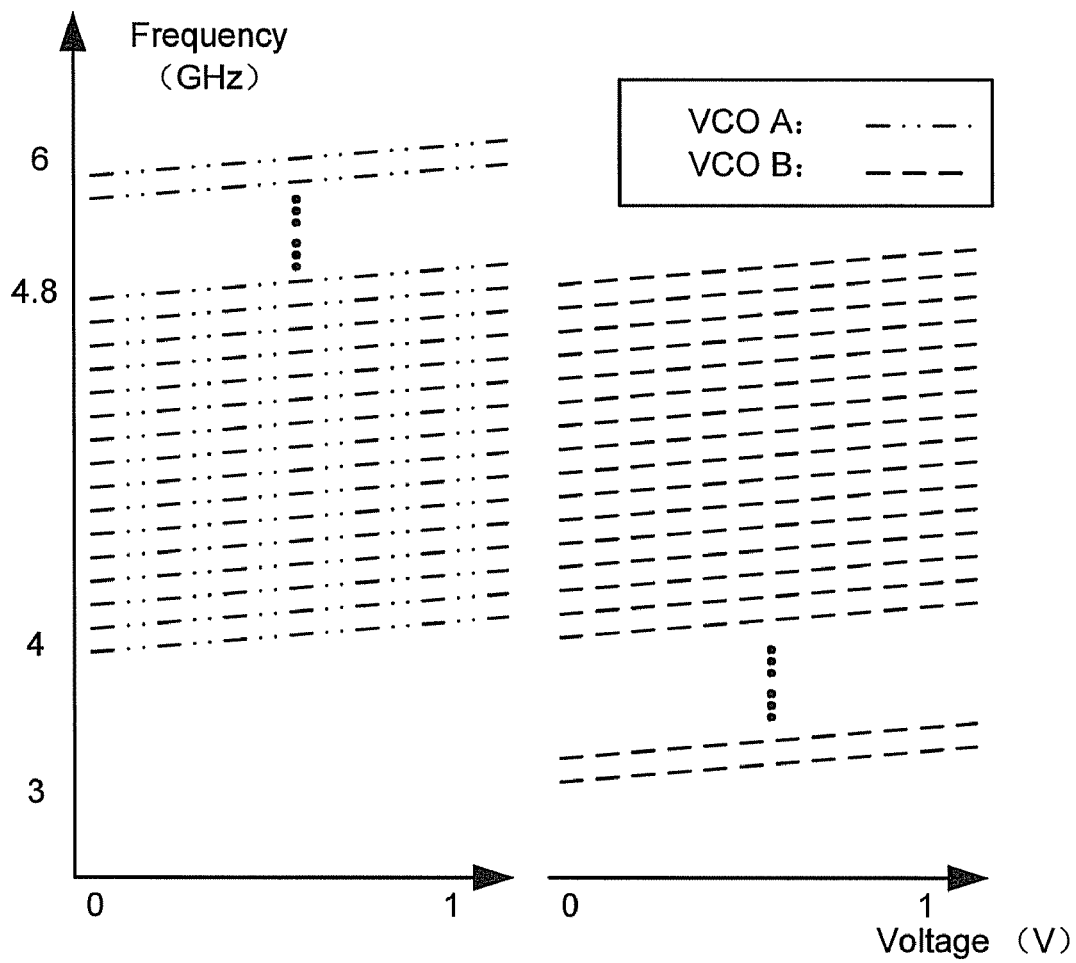
FIG. 3 is the schematic view showing the distribution of tuning curves of voltage-controlled oscillators A and B shown in FIG. 2.
Figure 4:
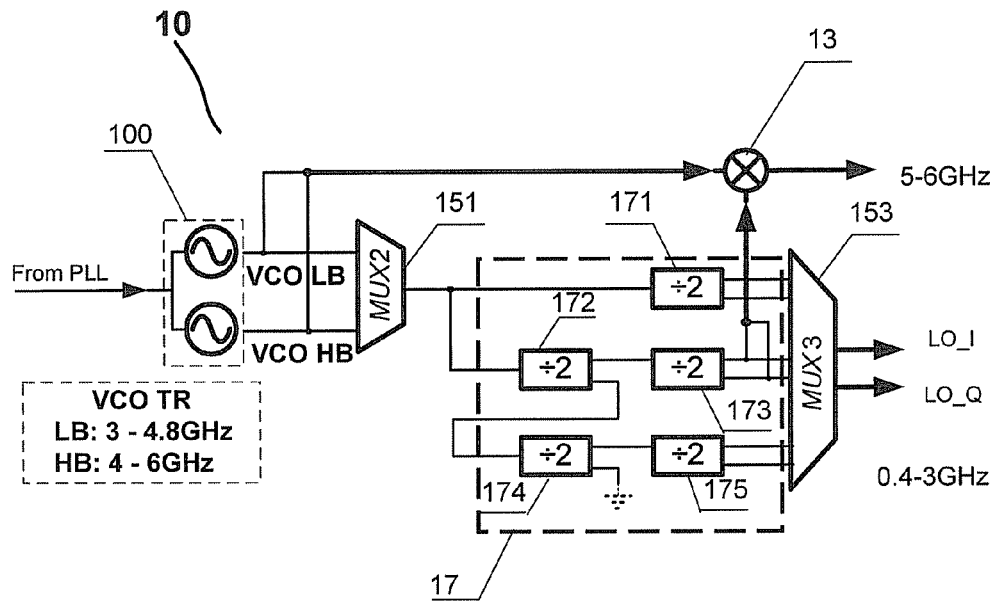
FIG. 4 is a schematic view of module structure of local oscillation generator of a frequency synthesizer provided according to an embodiment of the invention, of which the voltage-controlled oscillator employs the DMVCO shown in FIG. 2.
Figure 5:
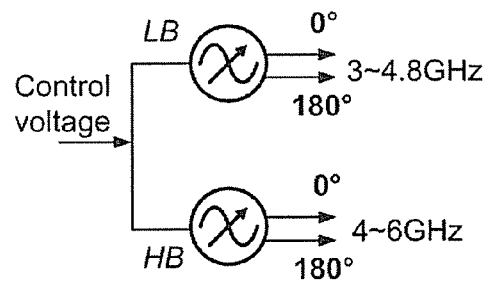
FIG. 5 is the schematic view showing the operation principle of the DMVCO shown in FIG. 2.
Figure 5:
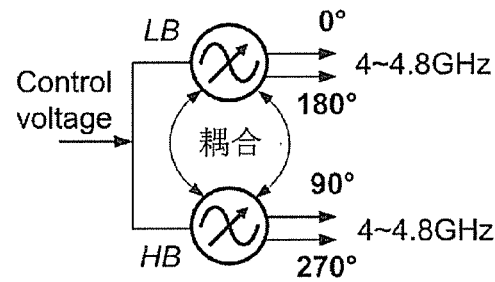
Figure 6:
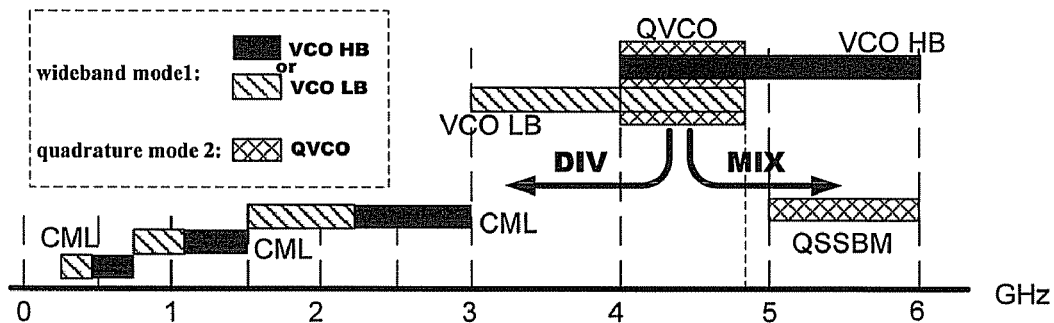
FIG. 6 is the schematic view showing the frequency spectrum plan of the frequency synthesizer shown in FIG. 4.

FIG. 2 is a schematic structural view of wideband-quadrature DMVCO provided according to an embodiment of the invention. FIG. 3 is the schematic view showing the distribution of tuning curves of voltage-controlled oscillators A and B shown in FIG. 2. FIG. 4 is a schematic view of module structure of local oscillation generator of a frequency synthesizer provided according to an embodiment of the invention, of which the voltage-controlled oscillator employs the DMVCO shown in FIG. 2. FIG. 5 is the schematic view showing the operation principle of the DMVCO shown in FIG. 2. FIG. 6 is the schematic view showing the frequency spectrum plan of the frequency synthesizer shown in FIG. 4.

Figure 1:
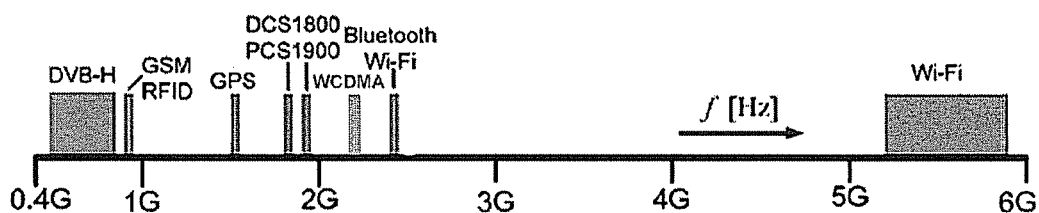
FIG. 1 is a distribution of frequency spectrum of some communication standards in present spatial environment.

Referring to FIG. 2, DMVCO 100 comprises a voltage-controlled oscillator A operating in a high frequency band and a voltage-controlled oscillator B operating in a low frequency band. Voltage-controlled oscillators A and B have substantially the same circuit structure and comprise the same components of which the description will be given in detail below. In this embodiment, in order to support various communication standard protocols, a tuning range from 0.4 to 3 GHz and a tuning range from 5-6 GHz (as shown in FIG. 4) are achieved by two VCOs in the DMVCO and frequency selecting device, divider and Quadrature Single Sideband Mixing process in FIG. 2, thus covering the distribution of frequency spectrum of common communication standards shown in FIG. 1.

Referring to FIGS. 2 and 3, voltage-controlled oscillators A and B comprise an on-chip inductor 110*a* and 110*b* respectively, and comprise a parasitic capacitor (not shown in the Figure) connecting in parallel to two ends of the on-chip inductor. Voltage-controlled oscillators A and B can be tuned in the frequency band range in which they operate, so as to generate tuning curves as shown in FIG. 3; obviously, voltage-controlled oscillator A operates in a high band (HB), and the voltage-controlled oscillator B operates in a low band (LB). Hereinafter, HB refers to a frequency range from 4 to 6 GHz, LB refers to a frequency range from 3-4.8 GHz, and a range from 4 to 4.8 GHz is the overlapped frequency band of HB and LB. In the drawings, VCO HB refers to voltage-controlled oscillator A, and VCO LB refers to the voltage-controlled oscillator B. It is noted that according to a target frequency band (frequency range) to be covered by the frequency synthesizer which employs the DMVCO, voltage-controlled oscillators A and B can be arranged to operate in other frequency bands different from those in the above embodiment.

Continuing with FIG. 2, a negative resistance module 160 is connected in parallel to both ends of LC resonant cavity, which module 160 serves to provide resonant cavity of voltage-controlled oscillators A or B with energy required for oscillating. In this embodiment, negative resistance module 160 comprises two transistors Mn cross-coupled with each other; moreover, negative resistance module 160 is also provided with a current sources array 161 which controls current flowing through the cross-coupled transistors Mn, whose gate electrode voltage is controlled by gate electrode bias voltage $V_{BIAS}$ and provide by a low-pass RC filter ($R_B$ and $C_B$ as shown in FIG. 2). The magnitude of currents flowing through the cross-coupled transistors Mn is controlled so that the voltage-controlled oscillators A or B always operates in the current-limited region and does not to enter the voltage-limited region or does not lead to a too small oscillating amplitude due to a too small current. Therefore, the performance and power consumption of voltage-controlled oscillators A/B can be better balanced. Moreover, a switch (e.g., $V_{COA\_EN}$, $V_{COB\_EN}$) can be provided between the current sources array and the cross-coupled transistors Mn so that a corresponding voltage-controlled oscillator can be controlled to operate or not by controlling the switch.

Referring to FIGS. 2, 4, 5 and 6, when DMVCO operates in the wideband mode, voltage-controlled oscillator A generates a differential signal in a tuning range from 4 to 6 GHz, and voltage-controlled oscillator B generates a differential signal in a tuning range from 3 to 4.8 GHz. The differential signal output by any of voltage-controlled oscillator A (i.e., VCO HB) and voltage-controlled oscillator B (i.e., VCO LB) can be processed by the divider in the frequency synthesizer 10 so as to generate a quadrature signal at a corresponding frequency. In this embodiment, the frequency selecting device of the frequency synthesizer 10 is realized by a multiplexer. An one-of-two multiplexer (MUX2) 151 of the first order selects one of the differential signals and the selected differential signal is divided by divider chain module 17 formed by multi-order dividers so as to generate quadrature signals in various band ranges. In this embodiment, five dividers (171-175) in divider chain module 17 are selected as current mode logic (CML) divider-by-2. For example, after the differential signal generated by voltage-controlled oscillator A is processed by divider 171 in divider chain module 17, a quadrature signal of 2-3 GHz can be generated; after the differential signal generated by voltage-controlled oscillator A is processed by dividers 172 and 173 in divider chain module 17, a quadrature signal of 1-1.5 GHz can be generated; and after the differential signal generated by voltage-controlled oscillator A is processed by dividers 172, 174 and 175 in divider chain module 17, a quadrature signal of 0.5-0.75 GHz can be generated. Similarly, after the differential signal generated by voltage-controlled oscillator B is processed by divider 171 in divider chain module 17, a quadrature signal of 1.5-2.4 GHz can be generated; after the differential signal generated by voltage-controlled oscillator B is processed by dividers 172 and 173 in divider chain module 17, a quadrature signal of 0.75-1.2 GHz can be generated; and after the differential signal generated by voltage-controlled oscillator B is processed by dividers 172, 174 and 175 in divider chain module 17, a quadrature signal of 0.375-0.6 GHz can be generated. Therefore, a quadrature signal of 0.4-3 GHz can be continuously generated; an one-of-three multiplexer (MUX3) 153 of the second order selects the quadrature signal output by one of the dividers so that a quadrature local oscillation signal covering the frequency band of 0.4-3 GHz as shown in FIG. 6 can be generated (e.g., LO_I or LO_Q as shown in FIG. 4). It is noted that in this embodiment, since voltage-controlled oscillator A and voltage-controlled oscillator B have an overlapped frequency band, there should corresponding exists an overlapped frequency band after the process by dividers (e.g., 1-1.5 GHz frequency band and 0.75-1.2 GHz frequency band have an overlapped frequency band of 1-1.2 GHz). At this time, a quadrature signal that has been performed a division operation by voltage-controlled oscillator B can be selected to cover the frequency band. Thus, the power consumption of voltage-controlled oscillator can be reduced, thereby reducing power consumption of the frequency synthesizer.

Therefore, when DMVCO 100 operates in a wideband mode, the frequency synthesizer 10 will also operate in wideband mode. Through a selective output of MXU 3 153, the frequency synthesizer 10 can cover the output frequency range of 0.4-3 GHz. Accordingly, when a quadrature local oscillation signal in the frequency band of 0.4-3 GHz is output, it is sufficient that only one of voltage-controlled oscillator A and voltage-controlled oscillator B operates. Therefore, the other one of voltage-controlled oscillator A and voltage-controlled oscillator B can stop operating, thereby greatly reducing energy consumption in wideband mode. Specifically, it can be realized by a switch (e.g., $V_{COA\_EN}$, $V_{COB\_EN}$) provided between the current source array and the cross-coupled transistors Mn.

In addition, DMVCO can also operate in a quadrature mode. In the prior art, QVCO can be considered as being formed by coupling two VCOs that are completely the same, i.e., two VCOs having substantially the same structure, operating in the same frequency range and having the same frequency tuning characteristics. Therefore, the two VCOs can be coupled to generate an accurate quadrature output. In the invention, when voltage-controlled oscillators A and B both operate in a frequency band of 4-4.8 GHz. DMVCO operates in a quadrature mode so that the frequency synthesizer 10 generates a quadrature signal of 5-6 GHz by QSSBM 13. In order to ensure that the phase error of quadrature signal input by QSSBM is small enough (it is better for the phase error to be smaller), it is required that the frequencies at which tuning curves of voltage-controlled oscillators A and B in the overlapped band prevail and the slope of the curves coincide to the greatest possibility. Moreover, it is required that the amplitudes of output signals of voltage-controlled oscillators A and B in the overlapped band coincide to the greatest possibility. That is, the frequency tuning characteristics in the overlapped band should be identical to the greatest possibility.

In order to meet the requirements on operation in the quadrature mode, a quadrature coupling module is provided in each VCO of DMVCO 100. In this embodiment, as shown in FIG. 2, when voltage-controlled oscillator A and voltage-controlled oscillator B operate in the overlapped band (4-4.8 GHz), they perform quadrature coupling output by a quadrature coupling module. At this time, DMVCO may be substantially equivalent to QVCO. Specifically, the quadrature coupling modules of voltage-controlled oscillator A and voltage-controlled oscillator B both comprise two quadrature coupled transistors Mc, the gate electrode of each quadrature coupled transistors Mc in one voltage-controlled oscillator is coupled with a corresponding output signal of resonant cavity of the other voltage-controlled oscillator; for example, as shown in FIG. 2, i+ is coupled with I+, i− is coupled with I−, q+ is coupled with Q+, and q− is coupled with Q−, thus realizing a quadrature coupling between voltage-controlled oscillator A and voltage-controlled oscillator B.

Referring further to FIGS. 2 and 3, a switched capacitor array 120, which is connected in parallel to the resonant cavity, is provided in each of voltage-controlled oscillator A and voltage-controlled oscillator B. In this embodiment, as shown in FIG. 3, through the switched capacitor array 120, the tuning range of 4-6 GHz of voltage-controlled oscillator A is divided into 32 tuning curves, and the tuning range of 3-4.8 GHz of voltage-controlled oscillator B is divided into 32 tuning curves. In the prior art, the switched capacitor array 120 is composed of binary-weighted switched capacitor units (e.g., 5 switched capacitor units will generate $2^5$ tuning curves). Besides, the oscillating frequency of voltage-controlled oscillator is calculated according to the following relationship (1):

$$f_{VCO,n} = \frac{1}{2\pi\sqrt{LC_{tot,n}}} \quad (1)$$

wherein fvco,n is the frequency of a corresponding tuning curve, $C_{tot,n}$ is the overall capacitance of resonant cavity, and $C_{tot,n}=C_p+C_{a,n}+C_v$, wherein $C_p$ is the overall parasitic capacitance (not shown in FIG. 2), $C_{a,n}$ is the overall capacitance of the switched capacitor array 120, $C_v$ is all of the variable capacitances (e.g., the switched varactor array 130 and a fixed varactor module 140 having a linearization function shown in FIG. 2)

Therefore, if the frequency of each tuning curves is controlled entirely through the use of binary-weighted switched capacitor units, it will be difficult for frequency intervals between tuning curves in the overlapped band range to be identical, thus making it hard to ensure that frequency parameters of frequency tuning characteristics of two VCOs to be identical in 4-4.8 GHz frequency band. In order that frequency tuning curves of two VCOs coincide in 4-4.8 GHz frequency band, the switched capacitor array 120 does not entirely employs binary-weighted switched capacitors; rather, 16 switched capacitor units and 4 binary-weighted switched capacitor units are provided, wherein the 16 switched capacitor units controls 16 tuning curves in the overlapped frequency band; by designing the controlling each switched capacitor unit in the switched capacitor array 120, it can be ensured that the intervals between two adjacent tuning curves in the overlapped frequency band are identical. That is, it is easy to ensure that the output frequencies of two voltage-controlled oscillators are identical. In addition, in this embodiment, 4 binary switched capacitors are used for the band outside the overlapped frequency band in order to reduce parasitic effect.

Figure 7:
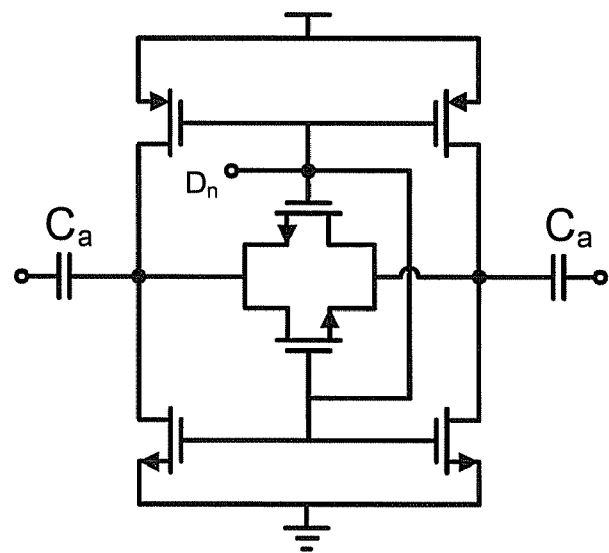
FIG. 7 is a schematic structural view of switched capacitor unit used in switched capacitor array 120 shown in FIG. 2.

FIG. 7 is a schematic structural view of switched capacitor units used in the switched capacitor array 120 shown in FIG. 2. As shown in FIG. 7, MIM capacitor $C_a$ is controlled by an intermediate switch (composed of two NMOS transistors), the controlling signal is Dn, and a bias electric level is provided by an pull-up transistor (composed of two PMOS transistors) and a pull-down transistor (composed of two NMOS transistors). The specific structure of switched capacitor units is not limited to the embodiment shown in FIG. 7.

Continuing with FIGS. 2 and 3, in the overlapped frequency band, even if the output frequency of two voltage-controlled oscillators are identical, it is also necessary to ensure, to the greatest possibility, that the tuning gains Kvco of the two voltage-controlled oscillators are identical. which reflects in FIG. 3 that the "slopes" of corresponding tuning curves are identical. The tuning gain of voltage-controlled oscillator A or B is calculated according to the following relationship (2):

$$K_{VCO,n} = \frac{\partial f_{VCO,n}}{\partial V_{ctrl}} = -\frac{1}{4\pi\sqrt{LC_{tot,n}^3}} \cdot \frac{\partial C_v}{\partial V_{ctrl}} \quad (2)$$

Wherein, $K_{VCO,n}$ is the slope of a corresponding tuning curve, is corresponding frequency of the tuning curve, $C_{tot,n}$ is the overall capacitance of resonant cavity, $C_V$ is the variable capacitance, $V_{ctrl}$ is the control voltage of voltage-controlled oscillator A or B.

Conventional voltage-controlled oscillators all employ a fixed varactor (not having a linearization function) physically fixed to resonant cavity of inductor-capacitor to achieve voltage controlling function of oscillators. Thus, it is easy to find from relationship (2) that when the overall capacitance $C_{tot,n}$ of resonant cavity is small, i.e., when the oscillating frequency of voltage-controlled oscillator is high, the slope of tuning curve is big; when the overall capacitance $C_{tot,n}$ of resonant cavity is large, i.e., when the oscillating frequency of voltage-controlled oscillator is low, the slope of tuning curve is small. In order to counterbalance the influence that the variation of $C_{tot,n}$ acts on the tuning gains of voltage-controlled oscillators, a switched varactor array 130 is provided in both voltage-controlled oscillator A and voltage-controlled oscillator B; the switched varactor array 130 is connected in parallel to the resonant cavity.

Figure 8:
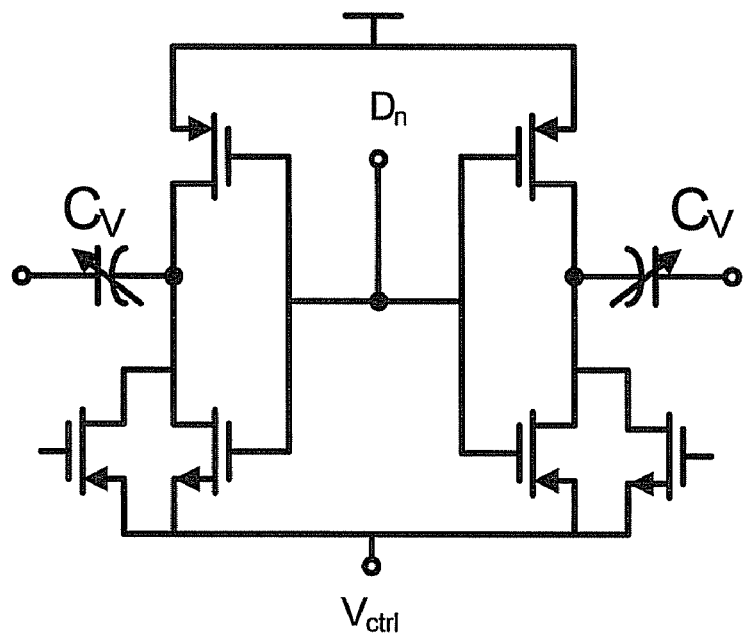
FIG. 8 is a schematic structural view of switched varactor unit used in switched varactor array 130 shown in FIG. 2.

FIG. 8 is a schematic structural view of switched varactor units used in the switched varactor array 130 shown in FIG. 2. In this embodiment, as shown in FIG. 8, the switched varactor array 130 comprises 16 (since "n" in relationship (2) is any integer between 1 and 16) switched varactor units shown in FIG. 8 so as to corresponding adjust slopes of 16 tuning curves in the overlapped frequency band. When $C_{tot,n}$ increases, more variable capacitors (Cv) are connected to the Vctrl end by means of the switch of the switched varactor units 130; when $C_{tot,n}$ decreases, the number of variable capacitors (Cv) that are connected to the Vctrl end is reduced by means of the switch of the switched varactor units 13, thus realizing control of slope of tuning curves. Therefore, the switched varactor array 130 can control tuning gain Kvco, and the frequency tuning characteristics of voltage-controlled oscillator A and B can be consistently designed as a fixed Kvco. Moreover, the frequency tuning characteristics of voltage-controlled oscillators A and B in the overlapped band can be fine tuned in frequency band so as to offset fluctuation of process, voltage, temperature (PVT).

It is noted that the specific structure of switched varactor units in switched varactor array 130 in not limited to the embodiment shown in FIG. 8. For example, each switched varactor unit can also be composed of two inversion-MOS transistor (I-MOS) variable capacitors, which can be fine tuned in frequency band or be connected to oscillator tuning voltage Vctrl to control tuning gain of VCO.

Continuing with FIGS. 2 and 3, the bias current of quadrature coupled transistor Mc can also be provided by current sources array 170 shown in the drawings. Therefore, it is easy to ensure that the oscillating amplitudes of voltage-controlled oscillators A and B are identical in the overlapped band so that their frequency tuning characteristics are closer in the overlapped band. A switch (IQ_EN) may be provided between quadrature coupled transistor Mc and current sources array 170; by controlling the switch, a switching of DMVCO may be made between the wideband mode and the quadrature mode.

Continuing with FIGS. 2 and 3, in the above embodiment, both switched capacitor array 120 and switched varactor array 130 can be digitally variable capacitor array, which makes it difficult to achieve a continuous tuning control of each tuning curve shown in FIG. 3. Therefore, a fixed varactor module 140 having a linearization function is also provided in both voltage-controlled oscillator A and voltage-controlled oscillator B.

Figure 9:
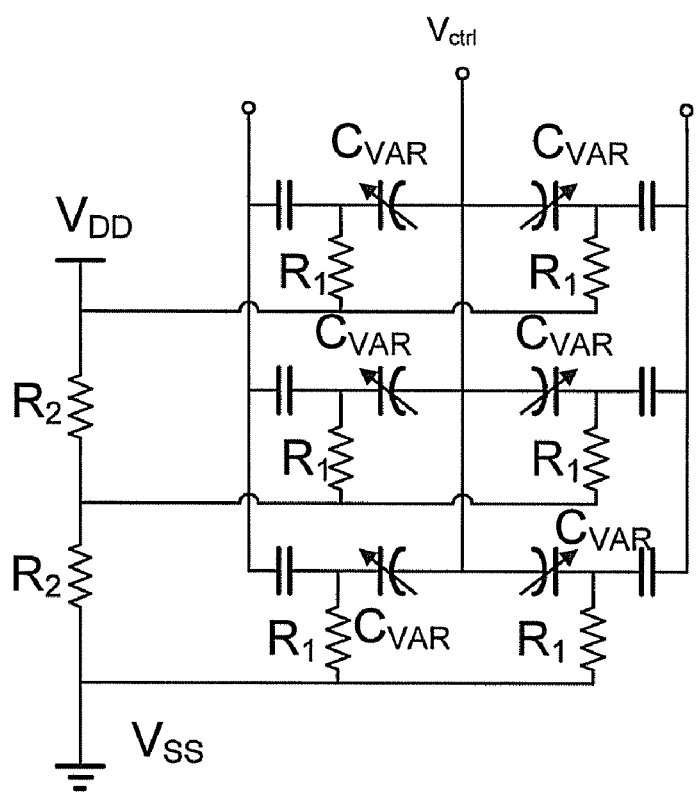
FIG. 9 is a schematic structural view of a fixed varactor module 140 having a linearization function shown in FIG. 2.

FIG. 9 is a schematic structural view of a fixed varactor module 140 having a linearization function shown in FIG. 2. As shown in FIGS. 2 and 9, the fixed varactor module 140 having a linearization function is also connected in parallel to the resonant cavity. In the fixed varactor module 140, variable capacitors $C_{VAR}$ at three biasing points are biased at three different bias voltages ($V_{DD}$, $V_{DD}/2$ and $V_{ss}$) respectively by a voltage dividing network composed of resistors R2; an isolation can be made between the variable capacitor $C_{VAR}$ and the biasing points by a large resistor R1. By being biased in this way, the linearization degree of corresponding tuning curves of voltage-controlled oscillators A and B can be greatly improved.

Figure 10:
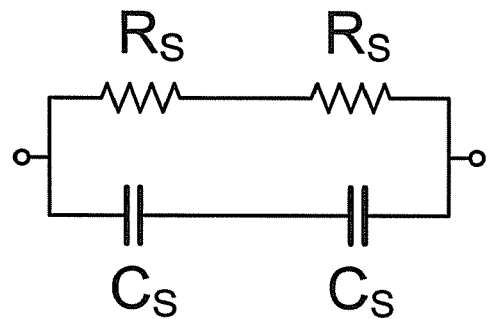
FIG. 10 is a schematic structural view of a phase-shifting network module 150 shown in FIG. 2.

Continuing with FIGS. 2 and 3, although switched capacitor array 120, switched varactor array 130 and fixed varactor module 140 having a linearization function can realize that frequency tuning characteristics of voltage-controlled oscillators A and B are substantially identical in the overlapped band, i.e., the tuning curves shown in FIG. 3 are close in the overlapped band; however, when voltage-controlled oscillators A and B achieve the function of QVCO in the overlapped band, they are very sensitive to mismatch of frequency and mismatch of amplitude; in order to reduce such a sensitivity to these mismatches, a phase-shifting network module 150 is provided in both voltage-controlled oscillators A and B. FIG. 10 is a schematic structural view of a phase-shifting network module 150 shown in FIG. 2. In this embodiment, after the use of phase-shifting module 15, the equivalent transconductance of large signals of quadrature coupled transistor Mc can be calculated according to the following relationship (3):

$$G_{m\_Mc} = \frac{g_{m\_Mc}}{1 + g_{m\_Mc} R_s} \frac{1 + s R_s C_s}{1 + s R_s C_s / (1 + g_{m\_Mc} R_s)} \quad (3)$$

Wherein, $G_{m\_Mc}$ is the equivalent transconductance of quadrature coupled transistor Mc, $g_{m\_Mc}$ is the transconductance of quadrature coupled transistor Mc, $R_S$ is the phase-shifting resistance of phase-shifting network module 150, $C_S$ is the phase-shifting capacitance of phase-shifting network module 150.

It can be seen from relationship (3) that by adjusting resistance $R_S$ and/or capacitance $C_S$ to be appropriate values, a phase-shift of approximately 90° can be provided. The phase-shift provided can greatly reduce the sensitivity of DMVCO in quadrature mode to frequency mismatch and amplitude mismatch so that DMVCO in quadrature mode can acquire a better phase noise performance and a more accurate quadrature output signal.

Figure 11:
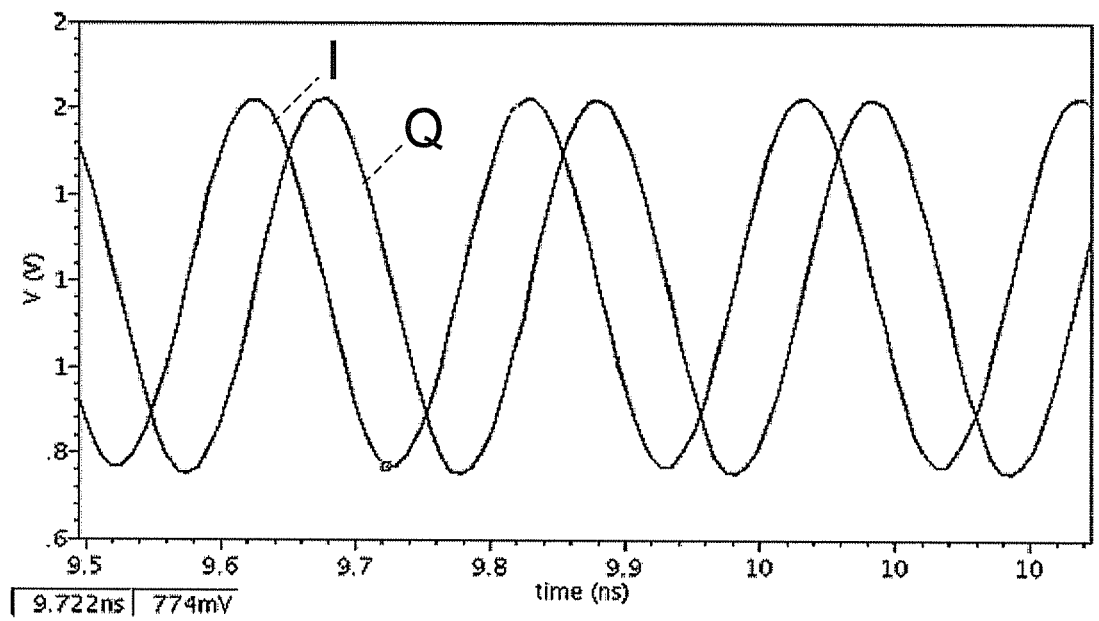
FIG. 11 is a schematic view showing the output signals of DMVCO of the embodiment shown in FIG. 2 in a quadrature mode.

Referring to FIGS. 4 and 5, when DMVCO 100 operates in the quadrature mode, both voltage-controlled oscillators A and B operate in the overlapped band and can be coupled together to generate a quadrature signal. FIG. 11 is a schematic view showing the outputs signals of DMVCO of the embodiment shown in FIG. 2 in a quadrature mode, wherein the quadrature signals (I and Q respectively) generated by DMVCO in the quadrature mode is schematically shown in FIG. 11. QSSBM 13 is provided in the frequency synthesizer 10. When the frequency synthesizer 10 operates in the quadrature mode, the quadrature signal output by DMVCO 100 and the quadrature signal output by divider 173 are input into QSSBM 13, which performs an upconversion so that a quadrature local oscillation signal of 5-6 GHz can be output. Therefore, as shown in FIG. 6, the frequency synthesizer 10 can cover the band of 5-6 GHz by means of mixer. It is understood that in other embodiments, the quadrature signals output by other dividers in the divider chain can be input into QSSBM 13.

It is known from above that when the frequency synthesizer covers a lower output frequency band (for example, 0.4-3 GHz), the frequency synthesizer and DMVCO operate in a wideband mode and DMVCO operates at a relatively lower frequency band; therefore, the power consumption of dividers and buffers used by the frequency synthesizer will be greatly reduced; when the frequency synthesizer covers a higher output frequency band (for example, 5-6 GHz), the frequency synthesizer and DMVCO operate in a quadrature mode, a quadrature signal required by QSSBM is provided by two voltage-controlled oscillators operating in a overlapped frequency band in DMVCO, thus avoiding the use of additional PPF and QVCO; therefore, the structure of frequency synthesizer which employs DMVCO is not complicated; not only the range of output frequency is guaranteed, but power consumption will not be increase, meaning that requirements on both the range of output frequency and power consumption are met. Moreover, QSSBM used in the frequency synthesizer can refrain a mirror signal occurring in frequency mixing, improve frequency spectrum purity of voltage-controlled oscillator, which making the voltage-controlled oscillator has good frequency spur performance.

It is noted that a description of frequency synthesizer covering frequency bands of 0.4-3 GHz and 5-6 GHz as well as DMVCO used by the frequency synthesizer is given in the above embodiments, and those skilled in the art can achieve a coverage of other bandwidth ranges according to the above teaching and enlightenment on the basis of the technology of software-defined radio.

Furthermore, as shown in FIG. 4, in the frequency synthesizer 10, the local oscillation generator typically further comprises a Phase-Locked Loop (PLL) module (not shown in the drawing). The PLL module can be used to control and stabilize the output frequency of DMVCO. Through the use of the frequency synthesizer 10 shown in FIG. 4, a radio receiving device (e.g., radio receiver) can be further formed, which comprises other specific components that are not described in detail herein.

The above embodiments mainly describe the DMVCO of the invention, the frequency synthesizer using the DMVCO as well as a radio receiving device. Although only some of the embodiments of the invention have been described, it is understood by those with ordinary skills in the art that the invention can be implemented in many other forms without departing the spirit and scope of the invention. Therefore, the illustrated examples and embodiments should be construed as being exemplary rather than limiting, and the invention can compass various modifications and alternatives without departing the spirit and scope of the invention as defined by appended claims.

The invention claimed is:

1. A dual-mode voltage-controlled oscillator, characterized by comprising a first voltage-controlled oscillator unit and a second voltage-controlled oscillator unit, the first voltage-controlled oscillator unit operating in a first frequency band, the second voltage-controlled oscillator unit operating in a second frequency band, the first frequency band and the second frequency band having an overlapped frequency band therebetween;
   each of the voltage-controlled oscillator units comprises a quadrature coupling module;
   the dual-mode voltage-controlled oscillator is operable to operate in a wideband mode or a quadrature mode;
   wherein, when operating in the wideband mode, a differential signal at a corresponding frequency is generated by only the first voltage-controlled oscillator unit or the second voltage-controlled oscillator unit;
   when operating in the quadrature mode, both the first voltage-controlled oscillator unit and the second voltage-controlled oscillator unit operates in the overlapped frequency band, the first voltage-controlled oscillator unit and the second voltage-controlled oscillator unit are coupled together by the quadrature coupling modules of the first voltage-controlled oscillator unit and the second voltage-controlled oscillator unit, and a quadrature signal at a corresponding frequency is generated.

2. The dual-mode voltage-controlled oscillator according to claim 1, wherein the first voltage-controlled oscillator unit and the second voltage-controlled oscillator unit have substantially the same frequency tuning characteristics in the overlapped frequency band.

3. The dual-mode voltage-controlled oscillator according to claim 2, wherein each of the voltage-controlled oscillator units further comprises:
   a switched capacitor array for controlling the frequencies at which corresponding tuning curves of the first voltage-controlled oscillator unit and the second voltage-controlled oscillator unit in the overlapped frequency band prevail to be the same; and
   a switched varactor array for controlling tuning gains of corresponding tuning curves of the first voltage-controlled oscillator unit and the second voltage-controlled oscillator unit in the overlapped frequency band to be the same.

4. The dual-mode voltage-controlled oscillator according to claim 3, wherein the switched capacitor array comprises a plurality of switched capacitor units each for correspondingly controlling the frequency at which one tuning curve in the overlapped frequency band prevails.

5. The dual-mode voltage-controlled oscillator according to claim 3, wherein the switched varactor array comprises a plurality of switched varactor units each for correspondingly controlling tuning gain of one tuning curve in the overlapped frequency band.

6. The dual-mode voltage-controlled oscillator according to claim 4, wherein the switched capacitor array further comprises a plurality of binary-weighted switched capacitor units, for correspondingly controlling the frequency at which tuning curves of the voltage-controlled oscillator outside the overlapped frequency band prevails.

7. The dual-mode voltage-controlled oscillator according to claim 3, wherein each voltage-controlled oscillator unit further comprises:
   a fixed varactor module having a linearization function for controlling linearization degree of tuning curves of the first voltage-controlled oscillator unit and the second voltage-controlled oscillator unit.

8. The dual-mode voltage-controlled oscillator according to claim 3, wherein each voltage-controlled oscillator unit further comprises:
   a phase-shifting network module for providing a phase-shift of substantially 90° in order to reduce the sensitivities of the first voltage-controlled oscillator unit and the second voltage-controlled oscillator unit to frequency mismatch and amplitude mismatch in the overlapped frequency band.

9. The dual-mode voltage-controlled oscillator according to claim 2, wherein each voltage-controlled oscillator unit further comprises an on-chip inductor and a parasitic capacitor.

10. The dual-mode voltage-controlled oscillator according to claim 1, wherein each voltage-controlled oscillator unit further comprises:
    a negative resistance module for providing resonant cavities of the voltage-controlled oscillator units with energy required for oscillating;
    wherein the negative resistance module comprises two transistors cross-coupled with each other and a first current source array; by controlling the first current source array to adjust the magnitude of current flowing through the cross-coupled transistors, the amplitude of output signals of the first voltage-controlled oscillator unit or the second voltage-controlled oscillator unit can be controlled.

11. The dual-mode voltage-controlled oscillator according to claim 10, wherein a first switch is provided between the first current source array and the cross-coupled transistors; when the dual-mode voltage-controlled oscillator operates in the wideband mode, the first switch is controlled to select any one of the first voltage-controlled oscillator unit and the second voltage-controlled oscillator unit.

12. The dual-mode voltage-controlled oscillator according to claim 1, wherein the quadrature coupling module comprises two quadrature coupled transistors, wherein the gate electrode of each of the quadrature coupled transistors in the first voltage-controlled oscillator unit or the second voltage-controlled oscillator unit is coupled with a corresponding output signal of the resonant cavity of the first voltage-controlled oscillator unit or the second voltage-controlled oscillator unit.

13. The dual-mode voltage-controlled oscillator according to claim 12, wherein a second current source array for providing the quadrature coupled transistors with biased current is provided in each of the voltage-controlled oscillator units.

14. The dual-mode voltage-controlled oscillator according to claim 13, wherein a second switch is provided between the quadrature coupled transistors and the second current source array, which is controlled to achieve a switching of the dual-mode voltage-controlled oscillator between the wideband mode and the quadrature mode.

15. The dual-mode voltage-controlled oscillator according to claim 1, wherein the first frequency band is about from 3 GHz to 4.8 GHz, the second frequency band is about from 4 GHz to 6 GHz, and the overlapped frequency band is about from 4 GHz to 4.8 GHz.

16. A frequency synthesizer comprising a local oscillation generator, the local oscillation generator characterized by comprising:
  the dual-mode voltage-controlled oscillators according to claim 1;
  a Quadrature Single Sideband Mixer (QSSBM); and
  a divider of one order or above;
  wherein, the frequency synthesizer is operable to operate in a wideband mode or a quadrature mode;
  when operating in the wideband mode, a differential signal generated by the first voltage-controlled oscillator unit or the second voltage-controlled oscillator unit is processed by the divider to generate a first quadrature local oscillation signal;
  when operating in the quadrature mode, a quadrature signal output after a quadrature coupling process and a quadrature signal output by the divider are input into the Quadrature Single Sideband Mixer (QSSBM) to perform a upconversion so as to generate a second quadrature local oscillation signal;
  the first quadrature local oscillation signal is used to cover a first output frequency band having a relatively low frequency, and the second quadrature local oscillation signal is used to cover a second output frequency band having a relatively high frequency.

17. The frequency synthesizer according to claim 16, wherein the local oscillation generator further comprises a first order frequency selecting device and a second order frequency selecting device;
  wherein the first order frequency selecting device selects a differential signal at a corresponding frequency output by the first voltage-controlled oscillator unit or the second voltage-controlled oscillator unit to be sent to the divider, the second order frequency selecting device selects a quadrature signal output by any of the dividers to output the first quadrature local oscillation signal.

18. The frequency synthesizer according to claim 16, wherein the first output frequency band is about from 0.4 GHz to 3 GHz, and the second output frequency band is about from 5 GHz to 6 GHz.

19. A wireless receiving device, characterized by comprising the frequency synthesizer according to claim 16.

20. The dual-mode voltage-controlled oscillator according to claim 7, wherein each voltage-controlled oscillator unit further comprises:
  a phase-shifting network module for providing a phase-shift of substantially 90° in order to reduce the sensitivities of the first voltage-controlled oscillator unit and the second voltage-controlled oscillator unit to frequency mismatch and amplitude mismatch in the overlapped frequency band.

* * * * *